(12) United States Patent
Hidaka et al.

(10) Patent No.: US 12,074,050 B2
(45) Date of Patent: *Aug. 27, 2024

(54) COMPOSITE SINTERED BODY, ELECTROSTATIC CHUCK MEMBER, ELECTROSTATIC CHUCK DEVICE, AND METHOD FOR PRODUCING COMPOSITE SINTERED BODY

(71) Applicant: SUMITOMO OSAKA CEMENT CO., LTD., Tokyo (JP)

(72) Inventors: Nobuhiro Hidaka, Tokyo (JP); Naoto Kimura, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 1372 days.

This patent is subject to a terminal disclaimer.

(21) Appl. No.: 16/497,743

(22) PCT Filed: Mar. 26, 2018

(86) PCT No.: PCT/JP2018/012039
§ 371 (c)(1),
(2) Date: Sep. 25, 2019

(87) PCT Pub. No.: WO2018/181130
PCT Pub. Date: Oct. 4, 2018

(65) Prior Publication Data
US 2020/0027770 A1   Jan. 23, 2020

(30) Foreign Application Priority Data

Mar. 30, 2017 (JP) .................. 2017-068710

(51) Int. Cl.
*C04B 35/645* (2006.01)
*C04B 35/117* (2006.01)
(Continued)

(52) U.S. Cl.
CPC ........ *H01L 21/6833* (2013.01); *C04B 35/117* (2013.01); *C04B 35/62625* (2013.01);
(Continued)

(58) Field of Classification Search
CPC . H01L 21/6833; H01L 21/683; C04B 35/117; C04B 2235/3217;
(Continued)

(56) References Cited

U.S. PATENT DOCUMENTS 11,345,639 B2 *  5/2022  Hidaka ................ C04B 35/645
2003/0123213 A1  7/2003  Kosakai
(Continued)

FOREIGN PATENT DOCUMENTS

JP    H05-295352 A   11/1993
JP    H06-157140 A    6/1994
(Continued)

OTHER PUBLICATIONS

International Search Report for PCT/JP2018/012039 (mailed Jun. 19, 2018).
(Continued)

*Primary Examiner* — Danny Nguyen
(74) *Attorney, Agent, or Firm* — Merchant & Gould P.C.

(57) ABSTRACT

A composite sintered body is a ceramic composite sintered body which includes metal oxide which is a main phase, and silicon carbide which is a sub-phase, in which crystal grains of the silicon carbide are dispersed in crystal grains of the metal oxide and at crystal grain boundaries of the metal oxide, and a proportion of the crystal grains of the silicon carbide dispersed in the crystal grains of the metal oxide is 25% or more in an area ratio with respect to a total crystal grains of the silicon carbide.

14 Claims, 4 Drawing Sheets

(51) Int. Cl.
  *C04B 35/626* (2006.01)
  *C04B 35/628* (2006.01)
  *H01J 37/32* (2006.01)
  *H01L 21/683* (2006.01)

(52) U.S. Cl.
  CPC ...... *C04B 35/62635* (2013.01); *C04B 35/628* (2013.01); *C04B 35/645* (2013.01); *H01J 37/32715* (2013.01); *C04B 35/62655* (2013.01); *C04B 2235/3217* (2013.01); *C04B 2235/3826* (2013.01); *C04B 2235/656* (2013.01); *C04B 2235/786* (2013.01); *C04B 2235/80* (2013.01); *C04B 2235/87* (2013.01); *C04B 2235/9669* (2013.01); *H01J 37/32642* (2013.01); *H01J 2237/2007* (2013.01)

(58) Field of Classification Search
  CPC ...... C04B 2235/3826; C04B 2235/786; C04B 2235/87; H01J 37/32715; H02N 13/00
  USPC .......................................................... 361/234
  See application file for complete search history.

(56) References Cited

U.S. PATENT DOCUMENTS

| | | | |
|---|---|---|---|
| 2008/0226894 | A1* | 9/2008 | Kobayashi ............ C04B 35/645 264/681 |
| 2017/0057875 | A1* | 3/2017 | Ishizuka ................. C04B 35/78 |
| 2019/0019713 | A1 | 1/2019 | Hidaka et al. |
| 2019/0043746 | A1 | 2/2019 | Yoshioka et al. |
| 2020/0211884 | A1 | 7/2020 | Hidaka et al. |
| 2021/0114937 | A1 | 4/2021 | Hidaka et al. |

FOREIGN PATENT DOCUMENTS

| | | |
|---|---|---|
| JP | 08-267305 B | 10/1996 |
| JP | 2003-152065 A | 5/2003 |
| JP | 2005-306635 A | 11/2005 |
| JP | 2008-127258 A | 6/2008 |
| JP | 2010-525930 A | 7/2010 |
| JP | 4744855 B2 | 8/2011 |
| WO | 2017/131159 A1 | 8/2017 |
| WO | 2018/155374 A1 | 8/2018 |
| WO | 2018/181130 A1 | 10/2018 |
| WO | 2019-004402 A1 | 1/2019 |

OTHER PUBLICATIONS

International Search Report for PCT/JP2019/012059 (Jun. 4, 2019).

* cited by examiner

COMPOSITE SINTERED BODY, ELECTROSTATIC CHUCK MEMBER, ELECTROSTATIC CHUCK DEVICE, AND METHOD FOR PRODUCING COMPOSITE SINTERED BODY

This application is a U.S. National Stage Application under 35 U.S.C. § 371 of International Patent Application No. PCT/JP2018/012039, filed on Mar. 26, 2018, which claims priority to Japanese Patent Application No. 2017-068710 filed on Mar. 30, 2017, the disclosures of all of which are hereby incorporated by reference in their entireties.

BACKGROUND

Technical Field

The present invention relates to a composite sintered body, an electrostatic chuck member, an electrostatic chuck device, and a method for producing a composite sintered body.

In a semiconductor manufacturing apparatus which performs a plasma process, an electrostatic chuck device in which a plate-shaped sample (a wafer) can be easily mounted on and fixed to a sample stage and it is possible to maintain a temperature of the wafer at a desired temperature is used. The electrostatic chuck device is provided with an electrostatic attraction electrode that generates an electrostatic force (Coulomb's force) between a base having one principal surface which is a pacing surface on which the wafer is placed, and the wafer placed on the placing surface (refer to, for example, Patent Literature No. 1). The base is usually made of a ceramic sintered body.

In such an electrostatic chuck device, the wafer is fixed by using the electrostatic force generated between the wafer and the electrostatic attraction electrode. Specifically, in the electrostatic chuck device, when fixing the wafer, voltage is applied to the electrostatic attraction electrode to generate an electrostatic force between the wafer and the electrostatic attraction electrode. On the other hand, when removing the wafer fixed to the placing surface in the electrostatic chuck device, the application of the voltage to the electrostatic attraction electrode is stopped to make the electrostatic force between the wafer and the electrostatic attraction electrode disappear.

CITATION LIST

Patent Literature

[Patent Literature No. 1] Japanese Patent No. 4744855

SUMMARY OF INVENTION

Technical Problem

In recent years, devices using a semiconductor tend to be highly integrated. For this reason, at the time of manufacture of the device, a wiring microfabrication technique or a three-dimensional mounting technique is required. In carrying out such a processing technique, the semiconductor manufacturing apparatus is required to (i) reduce an in-plane temperature distribution (temperature difference) of a wafer, and (ii) be able to reliably carryout a deep drilling processing technique.

In this specification, there is a case where the "degree of in-plane temperature distribution (temperature difference) of a wafer placed on a sample stage" is referred to as "temperature uniformity". "High temperature uniformity" means that the in-plane temperature distribution of the wafer is small.

In the electrostatic chuck device, (i) in order to reduce the in-plane temperature distribution (temperature difference) of a wafer, a technique for cooling a wafer placed on a sample stage by providing minute grooves in the sample stage and making a gas refrigerant (for example, helium) flow in the grooves is known. In order to enhance temperature uniformity in such an electrostatic chuck device, it is conceivable to increase a gas pressure of the refrigerant to improve cooling efficiency. On the other hand, in a case of increase the gas pressure of the refrigerant, the electrostatic chuck device is required to have a high adsorption force such that the wafer is not detached due to the pressure received from the refrigerant. In order to obtain the high adsorption force, it is preferable that the dielectric constant of a base of the electrostatic chuck device is high.

On the other hand, (ii) in order to allow the deep drilling processing technique to be reliably carried out, it is required to suppress scattering of incident ions at the time of etching and cause the incident ion to be incident at a desired position. For this reason, in recent years, in a semiconductor manufacturing apparatus using an electrostatic chuck device, a reduction in the frequency of a bias (RF) voltage has proceeded.

However, if the frequency of the bias voltage is reduced, the electrical characteristics of the base made of a ceramic sintered body in the electrostatic chuck device change as compared with a case where the bias voltage is a high frequency. Specifically, if a low-frequency alternating-current voltage is applied, the electrical characteristics of the base are strongly affected by a volume resistivity value (unit: $\Omega \cdot cm$). The smaller the volume resistivity value is, the larger the dielectric loss tangent depending on the volume resistivity value becomes.

If the dielectric loss tangent of the base becomes large, the base easily generates heat at the time of application of an alternating-current voltage, and therefore, improvement is required.

The present invention has been made in view of such circumstances and has an object to provide a composite sintered body for an electrostatic chuck, which has both a high dielectric constant and a low dielectric loss tangent. Further, the present invention has an object to provide an electrostatic chuck member and an electrostatic chuck device using such a composite sintered body. Further, the present invention has an object to provide a method for producing a composite sintered body, which allows such a composite sintered body to be easily produced.

Solution to Problem

In order to solve the above problem, according to an aspect of the present invention, there is provided a composite sintered body which is a ceramic composite sintered body, including: a metal oxide which is a main phase; and silicon carbide which is a sub-phase, in which crystal grains of the silicon carbide are dispersed in crystal grains of the metal oxide or at crystal grain boundaries of the metal oxide, and a proportion of the crystal grains of the silicon carbide dispersed in the crystal grains of the metal oxide is 25% or more in an area ratio with respect to a total crystal grains of the silicon carbide.

In the above aspect of the present invention, the metal oxide may be aluminum oxide or yttrium oxide.

In the above aspect of the present invention, an average crystal grain size of the metal oxide may be 1.2 μm or more and 10 μm or less.

According to an aspect of the present invention, there is provided an electrostatic chuck member including a plate-shaped base which is formed of, as a forming material, the composite sintered body described above, the base having one principal surface which is a placing surface on which a plate-shaped sample is placed, and an electrostatic attraction electrode provided on a side opposite to the placing surface of the base, or in an interior of the base.

According to an aspect of the present invention, there is provided an electrostatic chuck device including the electrostatic chuck member described above.

According to an aspect of the present invention, there is provided a method for producing a composite sintered body, including a step of mixing metal oxide particles and silicon carbide particles, a step of adjusting pH of slurry obtained in the mixing step to a range in which surface charges of the metal oxide particles in the slurry become positive and surface charges of the silicon carbide particles in the slurry become negative, a step of forming a formed body after a dispersion medium is removed from the slurry with adjusted pH, and a step of pressure-sintering the obtained formed body by heating the formed body to a temperature of 1600° C. or higher while compacting the formed body with a pressure of 25 MPa or more under a non-oxidative atmosphere.

In the method according to the above aspect of the present invention, the step of mixing metal oxide particles and silicon carbide particles may be a step of mixing metal oxide particles and silicon carbide particles while causing the metal oxide particles and the silicon carbide particles to collide with each other by injecting the metal oxide particles and the silicon carbide particles at high speed.

In the method according to the above aspect of the present invention, the method may further include a step of oxidizing surfaces of the silicon carbide particles, prior to the mixing step.

In the method according to the above aspect of the present invention, the step of adjusting pH may make the pH of the slurry 3 or more and 7 or less.

In the method according to the above aspect of the present invention, the metal oxide particles may have a metal oxide content of 99.99% or more.

Advantageous Effects of Invention

According to the present invention, it is possible to provide a composite sintered body for an electrostatic chuck, which has both the high dielectric constant and the low dielectric loss tangent. Further, it is possible to provide an electrostatic chuck member and an electrostatic chuck device using such a composite sintered body. Further, it is possible to provide a method for producing a composite sintered body, which allows such a composite sintered body to be easily produced.

DESCRIPTION OF EMBODIMENTS

Hereinafter, an electrostatic chuck device according to an embodiment will be described with reference to FIG. 1. In all of the following drawings, in order to make the drawings easy to see, dimensions, a ratio, or the like of each constitute element is appropriately changed.

[Electrostatic Chuck Device]

Figure 1:
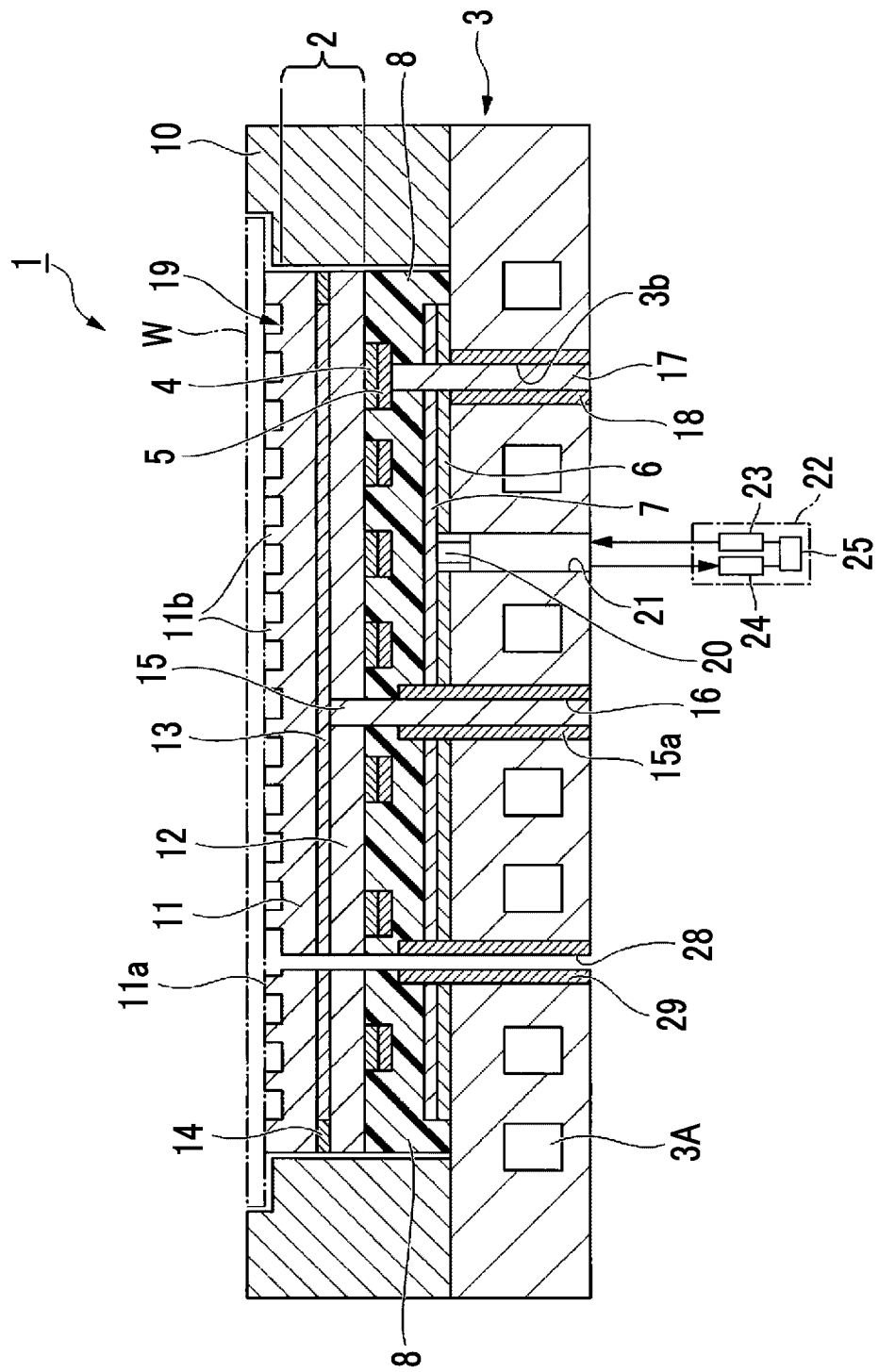
FIG. 1 is a sectional view showing an electrostatic chuck device of the present embodiment.

FIG. 1 is a sectional view showing an electrostatic chuck device of this embodiment. An electrostatic chuck device 1 of this embodiment is provided with an electrostatic chuck part 2 having a disk shape when viewed in a plan view and having a placing surface on the one principal surface (upper surface) side, and a temperature adjusting base part 3 which has a thick disk shape when viewed in a plan view and is provided below the electrostatic chuck part 2 to adjust the temperature of the electrostatic chuck part 2 to a desired temperature. Further, the electrostatic chuck part 2 and the temperature adjusting base part 3 are bonded to each other through an adhesive layer 8 provided between the electrostatic chuck part 2 and the temperature adjusting base part 3.

Hereinafter, these constituent elements will be described in order.

(Electrostatic Chuck Part)

The electrostatic chuck part 2 has a placing plate 11 having an upper surface serving as a placing surface 11a on which a plate-shaped sample W such as a semiconductor wafer is placed, a supporting plate 12 which is integrated with the placing plate 11 and supports the bottom portion side of the placing plate 11, an electrostatic attraction electrode 13 provided between the placing plate 11 and the supporting plate 12, and an insulating material layer 14 which insulates the surroundings of the electrostatic attraction electrode 13. Each of the placing plate 11 and the supporting plate 12 corresponds to a "base" in the present invention.

The placing plate 11 and the supporting plate 12 are disk-shaped members in which the shapes of superimposed surfaces are the same. Each of the placing plate 11 and the supporting plate 12 is made of a ceramic sintered body having mechanical strength and durability against corrosive gas and plasma thereof. The material for forming the placing plate 11 and the supporting plate 12 will be described in detail later.

A plurality of projection portions 11b each having a diameter smaller than the thickness of the plate-shaped sample are formed at predetermined intervals on the placing surface 11a of the placing plate 11, and the projection portions 11b support the plate-shaped sample W.

The thickness of the entirety including the placing plate 11, the supporting plate 12, the electrostatic attraction electrode 13, and the insulating material layer 14, that is, the thickness of the electrostatic chuck part 2 is, for example, 0.7 mm or more and 5.0 mm or less.

For example, if the thickness of the electrostatic chuck part 2 falls below 0.7 mm, it becomes difficult to secure the mechanical strength of the electrostatic chuck part 2. If the thickness of the electrostatic chuck part 2 exceeds 5.0 mm, the thermal capacity of the electrostatic chuck part 2 is increased, and thus the thermal responsiveness of the plate-shaped sample W placed thereon deteriorates, and due to an increase in the heat transfer in a lateral direction of the electrostatic chuck part, it becomes difficult to maintain the in-plane temperature of the plate-shaped sample W at a desired temperature pattern. The thickness of each part described here is an example and is not limited to the range described above.

The electrostatic attraction electrode 13 is used as an electrostatic chucking electrode for generating electric charges and fixing the plate-shaped sample W with an electrostatic attraction force, and the shape or the size thereof is appropriately adjusted according to the use thereof.

The electrostatic attraction electrode 13 is preferably formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

The thickness of the electrostatic attraction electrode 13 is not particularly limited. However, for example, a thickness of 0.1 μm or more and 100 μm or less can be selected, and a thickness of 5 μm or more and 20 μm or less is more preferable.

If the thickness of the electrostatic attraction electrode 13 falls below the lower limit value described above, it becomes difficult to secure sufficient electrical conductivity. If the thickness of the electrostatic attraction electrode 13 exceeds the upper limit value described above, cracking easily occurs in the joint interfaces between the electrostatic attraction electrode 13, and the placing plate 11 and the supporting plate 12 due to a difference in coefficient of thermal expansion between the electrostatic attraction electrode 13, and the placing plate 11 and the supporting plate 12.

The electrostatic attraction electrode 13 having such a thickness can be easily formed by a film formation method such as a sputtering method or a vapor deposition method, or a coating method such as a screen printing method.

The insulating material layer 14 surrounds the electrostatic attraction electrode 13 to protect the electrostatic attraction electrode 13 from corrosive gas and plasma thereof, and joins and integrates a boundary portion between the placing plate 11 and the supporting plate 12, that is, an outer peripheral portion region except for the electrostatic attraction electrode 13. The insulating material layer 14 is formed of an insulating material having the same composition or the same main component as the material configuring the placing plate 11 and the supporting plate 12.

(Temperature Adjusting Base Part)

The temperature adjusting base part 3 adjusts the temperature of the electrostatic chuck part 2 to a desired temperature and has a thick disk shape. As the temperature adjusting base part 3, for example, a liquid-cooling base or the like, in which a flow path 3A for circulating a refrigerant is formed in the interior thereof, is suitable.

As a material configuring the temperature adjusting base part 3, as long as it is metal which has excellent thermal conductivity, electrical conductivity, and workability, or a compound material which includes the metal, there is no particular limitation. For example, aluminum (Al), an aluminum alloy, copper (Cu), a copper alloy, stainless steel (SUS), or the like can be suitably used. It is preferable that at least the surface which is exposed to plasma, of the temperature adjusting base part 3, is subjected to alumite treatment or has an insulating film such as alumina formed thereon.

An insulating plate 7 is bonded to the upper surface side of the temperature adjusting base part 3 through an adhesion layer 6. The adhesion layer 6 is made of a sheet-shaped or film-shaped adhesive resin having heat resistance and insulating properties, such as polyimide resin, silicone resin, or epoxy resin. The adhesion layer is formed in a thickness in a range of about 5 μm to 100 μm, for example. The insulating plate 7 is made of a thin plate, a sheet, or a film of resin having heat resistance, such as polyimide resin, epoxy resin, or acrylic resin.

The insulating plate 7 may be an insulating ceramic plate instead of a resin sheet, or may be a thermally sprayed film having insulating properties, such as alumina.

(Focus Ring)

A focus ring 10 is a member that has a ring shape when viewed in a plan view and is placed on a peripheral portion of the temperature adjusting base part 3. The focus ring 10 is formed of, for example, a material having electrical conductivity equivalent to that of the wafer which is placed on the placing surface. By disposing the focus ring 10, it is possible to make an electrical environment with respect to plasma substantially coincide with that in the wafer at a peripheral portion of the wafer, and thus it is possible to make it difficult for a difference or bias in plasma treatment to occur between the central portion and the peripheral portion of the wafer.

(Other Members)

A power supply terminal 15 for applying a direct-current voltage to the electrostatic attraction electrode 13 is connected to the electrostatic attraction electrode 13. The power supply terminal 15 is inserted into a through-hole 16 penetrating the temperature adjusting base part 3, the adhesive layer 8, and the supporting plate 12 in a thickness direction. An insulator 15a having insulating properties is provided on the outer periphery side of the power supply terminal 15, and the power supply terminal 15 is insulated from the temperature adjusting base part 3 made of metal, by the insulator 15a.

In the drawing, the power supply terminal 15 is shown as an integral member. However, the power supply terminal 15 may be configured by electrically connecting a plurality of members. The power supply terminal 15 is inserted into the temperature adjusting base part 3 and the supporting plate 12, which have different coefficients of thermal expansion, and therefore, it is favorable if, for example, a portion which is inserted into the temperature adjusting base part 3 and a portion which is inserted into the supporting plate 12 are made of different materials.

As the material of the portion (extraction electrode) connected to the electrostatic attraction electrode 13 and inserted into the supporting plate 12, of the power supply terminal 15, as long as it is a conductive material having excellent heat resistance, there is no particular limitation. However, a material having a coefficient of thermal expansion which is close to the coefficients of thermal expansion of the electrostatic attraction electrode 13 and the supporting plate 12 is preferable. For example, it is made of a conductive ceramic material such as $Al_2O_3$—TaC.

The portion inserted into the temperature adjusting base part 3, of the power supply terminal 15, is made of a metal material such as tungsten (W), tantalum (Ta), molybdenum (Mo), niobium (Nb), or a Kovar alloy, for example.

It is favorable if these two members are connected to each other with a silicone-based conductive adhesive having flexibility and resistance to electricity.

A heater element 5 is provided on the lower surface side of the electrostatic chuck part 2. The heater element 5 is obtained, for example, by processing a non-magnetic metal thin plate, for example, a titanium (Ti) thin plate, a tungsten (W) thin plate, a molybdenum (Mo) thin plate, or the like, having a constant thickness of 0.2 mm or less, preferably about 0.1 mm, into a desired heater shape, for example, a shape in which a band-like conductive thin plate meanders and the entire contour is an annular shape, by a photolithography method or laser processing.

The heater element 5 may be provided by bonding a non-magnetic metal thin plate to the electrostatic chuck part 2 and then processing and forming the non-magnetic metal thin plate on the surface of the electrostatic chuck part 2, or may be provided by transfer-printing the heater element 5 processed and formed at a position different from the electrostatic chuck part 2 onto the surface of the electrostatic chuck part 2.

The heater element 5 is bonded and fixed to the bottom surface of the supporting plate 12 by an adhesion layer 4 which is made of a sheet-shaped or film-shaped silicone resin or acrylic resin having a uniform thickness and having heat resistance and insulating properties.

A power supply terminal 17 for supplying electric power to the heater element 5 is connected to the heater element 5. As the material configuring the power supply terminal 17, the same material as the material configuring the power supply terminal 15 described above can be used. The power supply terminal 17 is provided so as to pass through a through-hole 3b formed in the temperature adjusting base part 3. An insulator 18 having insulating properties is provided on the outer periphery side of the power supply terminal 17, and the power supply terminal 17 is insulated from the temperature adjusting base part 3 made of metal, by the insulator 18.

Further, a temperature sensor 20 is provided on the lower surface side of the heater element 5. In the electrostatic chuck device 1 of this embodiment, an installation hole 21 is formed so as to penetrate the temperature adjusting base part 3 and the adhesion layer 6 in the thickness direction, and the temperature sensor 20 is installed at the uppermost portion of the installation hole 21. It is preferable that the temperature sensor 20 is installed at a position as close to the heater element 5 as possible, and therefore, the installation hole 21 may be formed to extend so as to protrude further toward the adhesive layer 8 side from the structure shown in the drawing such that the temperature sensor 20 and the heater element 5 are brought closer to each other.

The temperature sensor 20 is, for example, a fluorescent emission type temperature sensor in which a phosphor layer (not shown) is formed on the upper surface side of a rectangular parallelepiped-shaped light transmission body made of quartz glass or the like, and is bonded to the lower surface of the heater element 5 by a silicone resin-based adhesive or the like having translucency and heat resistance.

The phosphor layer is made of a material that generates fluorescence in response to heat input from the heater element 5. As the material for forming the phosphor layer, as long as it is a material generating fluorescence in response to heat generation, a wide variety of fluorescent materials can be selected. As the material for forming the phosphor layer, a fluorescent material to which a rare earth element having an energy level suitable for light emission is added, a semiconductor material such as AlGaAs, metal oxide such as magnesium oxide, and a mineral such as ruby or sapphire can be given as an example, and a material appropriately selected from these materials can be used.

The temperature sensor 20 corresponding to the heater element 5 is provided at an arbitrary position which does not interfere with the power supply terminal or the like and is in a circumferential direction of the lower surface of the heater element 5.

A temperature measurement part 22 which measures the temperature of the heater element 5 from the fluorescence of the temperature sensor 20 is composed of, for example, an excitation unit 23 which irradiates the phosphor layer with excitation light on the outside (the lower side) of the installation hole 21 of the temperature adjusting base part 3, a fluorescence detector 24 which detects the fluorescence emitted from the phosphor layer, and a control unit 25 which controls the excitation unit 23 and the fluorescence detector 24 and calculates the temperature of a main heater, based on the fluorescence.

Further, the electrostatic chuck device 1 has a gas hole 28 provided so as to penetrate from the temperature adjusting base part 3 to the placing plate 11 in the thickness direction thereof. A tubular insulator 29 is provided at an inner peripheral portion of the gas hole 28.

A gas supply device (cooling means) (not shown) is connected to the gas hole 28. Cooling gas (heat transfer gas) for cooling the plate-shaped sample W is supplied from the gas supply device through the gas hole 28. The cooling gas is supplied to grooves 19 which are formed between the plurality of projection portions 11b on the upper surface of the placing plate 11 through the gas hole, and cools the plate-shaped sample W.

Further, the electrostatic chuck device 1 has a pin insertion hole (not shown) provided so as to penetrate from the temperature adjusting base part 3 to the placing plate 11 in the thickness direction thereof. The pin insertion hole can adopt the same configuration as that of the gas hole 28, for example. A lift pin for removal of the plate-shaped sample is inserted into the pin insertion hole.

The electrostatic chuck device 1 has the configuration as described above.

(Composite Sintered Body)

Next, the base (each of the placing plate 11 and the supporting plate 12) of this embodiment will be described in detail.

Each of the placing plate 11 and the supporting plate 12 of this embodiment is formed of a ceramic composite sintered body which includes metal oxide and silicon carbide.

The metal oxide in the composite sintered body is a main phase. Specifically, the proportion of the metal oxide in the entire composite sintered body is preferably 92% by mass or more and more preferably 94% by mass.

The silicon carbide in the composite sintered body is a sub-phase. Specifically, the proportion of the silicon carbide in the entire composite sintered body is preferably 8% by mass or less and more preferably 6% by mass or less.

As the metal oxide of the composite sintered body of this embodiment, aluminum oxide or yttrium oxide can be used.

In the composite sintered body of this embodiment, the average crystal grain size of the metal oxide is preferably 1.2 µm or more and 10 µm or less and more preferably 1.3 µm or more and 5 µm or less.

In the composite sintered body, if the average crystal grain size of the metal oxide is equal to or more than the lower limit value described above, a sufficient insulation effect can be exhibited without excessively lowering the resistivity of the particle itself of the metal oxide. Further, if the average crystal grain size of the metal oxide is equal to or less than the upper limit value described above, the mechanical strength of the obtained sintered body becomes sufficiently high, and thus damage (chipping) does not easily occur.

In the composite sintered body, the average crystal grain size of the metal oxide can be adjusted by controlling a sintering temperature. If the sintering temperature increases, the average crystal grain size of the metal oxide tends to become large, and if the sintering temperature is lowered, the average crystal grain size of the metal oxide tends to become small.

Further, in the composite sintered body of this embodiment, the crystal grains of the silicon carbide are dispersed in the crystal grains of the metal oxide and at the crystal grain boundary of the metal oxide.

Further, in the composite sintered body of this embodiment, the proportion of the crystal grains of the silicon carbide dispersed in the crystal grains of the metal oxide is 25% or more in an area ratio with respect to the total crystal grains of the silicon carbide. The remaining crystal grains of the silicon carbide are present at the grain boundaries of the metal oxide.

In the composite sintered body, if the proportion of the "crystal grains of the silicon carbide dispersed in the crystal grains of the metal oxide" to the "total crystal grains of the silicon carbide" is 25% or more in an area ratio, it is possible to sufficiently improve insulation properties. In order to improve the insulation properties, the larger the proportion, the better, and a state where all the crystal grains of the silicon carbide are dispersed in the crystal grains of the aluminum oxide is particularly preferable.

If the proportion is 25% or more, the dielectric constant of the composite sintered body is increased. Further, if the proportion is 25% or more, a dielectric loss tangent at a low frequency becomes small.

In the present invention, the "proportion of the crystal grains of the silicon carbide dispersed in the crystal grains of the metal oxide" in the composite sintered body is calculated from a scanning electron micrograph of any visual field of the composite sintered body.

That is, an electron micrograph at a magnification of 10000 is taken in a randomly selected visual field, and the total area of the crystal grains of the silicon carbide taken in the electron micrograph is regarded as the area of the "total crystal grains of the silicon carbide". On the other hand, in the above electron micrograph, the area of the "crystal grains of the silicon carbide dispersed in the crystal grains of the metal oxide" is determined. From the area determined in this manner, the proportion of the "crystal grains of the silicon carbide dispersed in the crystal grains of the metal oxide" to the "total crystal grains of the silicon carbide" is determined in an area ratio.

The same processing is performed in electron micrographs of two visual fields, and the average value is determined as an area ratio representing the "proportion of the crystal grains of the silicon carbide dispersed in the crystal grains of the metal oxide".

In the composite Sintered body of this embodiment, the average crystal grain size of the crystal grains of the silicon carbide is preferably 0.03 µm or more and 1 µm or less and more preferably 0.05 µm or more and 0.25 µm or less.

In the composite sintered body of this embodiment, the average crystal grain size of the crystal grains of the silicon carbide dispersed in the crystal grains of the metal oxide is preferably 0.03 µm or more and 0.7 µm or less and more preferably 0.05 µm or more and 0.2 µm or less.

In the composite sintered body of this embodiment, the average crystal grain size of the crystal grains of the silicon carbide, which are present at the crystal grain boundaries of the metal oxide, is preferably 0.03 µm or more and 1 µm or less and more preferably 0.05 µm or more and 0.3 µm or less.

The composite sintered body which is the material for forming each of the placing plate 11 and the supporting plate 12 can achieve both a high dielectric constant and a high volume resistivity, that is, both a high dielectric constant and a low dielectric loss tangent, with the configuration as described above.

That is, the metal oxide which is a main phase, among the materials configuring the composite sintered body of this embodiment, is an insulator, and the silicon carbide which is a sub-phase is an electric conductor. For this reason, if an electric current is tried to flow through the composite sintered body, electrons easily move along the crystal grain boundary in which an electric conductor is disposed.

At this time, in a composite sintered body having the same composition, which is known in the related art, it is known that the crystal grains of silicon carbide of 80% or more with respect to the total crystal grains of the silicon carbide are present at crystal grain boundaries of metal oxide.

In contrast, in the composite sintered body of this embodiment, the proportion of the crystal grains of the silicon carbide dispersed in the crystal grains of the metal oxide is 25% or more in an area ratio with respect to the total crystal grains of the silicon carbide.

That is, at the crystal grain boundaries of the metal oxide, the crystal grains of the silicon carbide of 75% or less with respect to the total crystal grains of the silicon carbide are present.

For this reason, in the composite sintered body of this embodiment, since the amount of electric conductors (silicon carbide) present at the crystal grain boundaries where electrons easily move is smaller than that in a composite sintered body of the related art, the electrons are difficult to move, and thus it is thought that the volume resistivity value becomes high.

Further, in the composite sintered body of this embodiment, the amount of silicon carbides dispersed in the crystal grains of the metal oxide is 25% or more, which is larger than that in the related art. In this manner, if the proportion of the silicon carbides which are dispersed in the crystal grains of the metal oxide increases, the distance between the silicon carbide particles, which are electric conductors, is shortened in the crystal grain, and thus the electric capacity increases. For this reason, in the composite sintered body as in this embodiment, the dielectric constant tends to become high.

The proportion of the crystal grains of the silicon carbide dispersed in the crystal grains of the metal oxide is preferably 30% or more in an area ratio with respect to the total crystal grains of the silicon carbide, and more preferably 40% or more.

In silicon carbide, a large number of crystal structures are known, and silicon carbide having a 3C type (zincblende type) crystal structure in a cubic system, silicon carbide having a wurtzite type crystal structure in a hexagonal system of a 4H type, a 6H type, or the like, and silicon carbide having a 15R type crystal structure in a rhombohedral system can be given as examples. Among these, the silicon carbide having a 3C type crystal structure is referred to as "β-SiC". Further, all the silicon carbides having crystal structures other than the 3C type crystal structure are referred to as "α-SiC".

In the placing plate 11 and the supporting plate 12 of this embodiment, it is preferable that SiC which is included in the composite sintered body is β-SiC. Further, in the sintered body, it is preferable that the crystal grains of β-SiC are present to be dispersed in a state of being surrounded by the crystal grains of the metal oxide which is a matrix material. The volume ratio of β-SiC is preferably 4% by volume or more and 15% by volume or less and more preferably 6% by volume or more and 10% by volume or less, with respect to the entire composite sintered body.

If the volume ratio of β-SiC is smaller than the lower limit value described above, the expression effect of electron conductivity by SiC particles is small. Further, if the volume ratio of β-SiC is larger than the upper limit value described above, there is a concern that SiC particles may come into contact with each other to cause a decrease in resistance value through SiC particles.

Further, in the composite sintered body of this embodiment, the amount of metal impurities other than aluminum and silicon is preferably 100 ppm or less. The amount of metal impurities is preferably 50 ppm or less and more preferably 25 ppm or less.

[Method for Producing Composite Sintered Body]

A method for producing a composite sintered body according to this embodiment includes:

(a) a step of mixing the metal oxide particles and the silicon carbide particles while causing the metal oxide particles and the silicon carbide particles to collide with each other by injecting the metal oxide particles and the silicon carbide particles at high speed;

(b) a step of adjusting pH of slurry obtained in the mixing step to a range in which the surface charges of the metal oxide particles in the slurry become positive and the surface charges of the silicon carbide particles in the slurry become negative;

(c) a step of forming a formed body after the pH is adjusted and a dispersion medium is removed from the slurry; and (d) a step of pressure-sintering the obtained formed body by heating the formed body to a temperature of 1600° C. or higher while compacting the formed body with a pressure of 25 MPa or more under a non-oxidative atmosphere.

In this embodiment, a case where aluminum oxide is used as the metal oxide will be described below.

In the method for producing a composite sintered body according to this embodiment, it is preferable that the aluminum oxide particles which are used have an aluminum oxide content of 99.99% or more, and more preferably 99.9999% or more. Such high-purity aluminum oxide particles can be prepared by using an alum method. In the aluminum oxide particles prepared by using the alum method, the content of sodium atoms which are metal impurities can be significantly reduced compared to aluminum oxide particles prepared by using, for example, a Bayer method. Further, as long as aluminum oxide particles having a desired purity can be obtained, various methods can be adopted.

((a) Mixing Step)

In the mixing step, aluminum oxide particles dispersed in the dispersion medium and silicon carbide particles dispersed in the dispersion medium are mixed while causing the aluminum oxide particles and the silicon carbide particles to collide with each other by injecting the aluminum oxide particles and the silicon carbide particles at high speed by pressurizing the aluminum oxide particles and the silicon carbide particles, by using a two-stream particle collision type pulverizing and mixing device. In this way, the aluminum oxide particles and the silicon carbide particles are pulverized and a dispersion liquid (slurry) containing these pulverized particles is obtained.

When causing the aluminum oxide particles and the silicon carbide particles to collide with each other, large particles have large kinetic energy at the time of collision and are easily pulverized. On the other hand, small particles have small kinetic energy at the time of collision and are not easily pulverized. For this reason, the aluminum oxide particles and the silicon carbide particles which are obtained by using the above-mentioned pulverizing and mixing device become particles with few coarse particles or excessively pulverized particles and having a narrow particle size distribution width. Therefore, if the mixed particles pulverized and mixed by using the two-stream particle collision type pulverizing and mixing device are used, abnormal grain growth with coarse particles as nuclei can be suppressed in the sintering step.

Further, in a case of performing the pulverizing and mixing by using such a pulverizing and mixing device, for example, compared to a method of performing pulverizing and mixing by using media such as a ball mill or a bead mill, it is possible to suppress mixing-in of impurities due to damage to each medium.

The method for producing a composite sintered body according to this embodiment may include a step of performing oxidation treatment on the surfaces of the silicon carbide particles in advance by heating the silicon carbide particles to be used, under an oxidizing atmosphere (for example, under an air atmosphere). Hereinafter, the oxidation treatment is referred to as "pre-oxidation". The pre-oxidation is performed, for example, by heating at 500° C. for 12 hours.

By performing the pre-oxidation treatment on the silicon carbide particles, the hydrophilicity of the silicon carbide particles is enhanced. In this way, dispersibility of the silicon carbide particles in the slurry is improved.

((b) Step of Adjusting pH)

In the step of adjusting pH, the pH adjustment is performed in consideration of the surface charges of the aluminum oxide particles and the silicon carbide particles in the slurry. The slurry (slurry before pH adjustment) which is obtained in the mixing step usually exhibits basicity of about pH 11.

Figure 2:
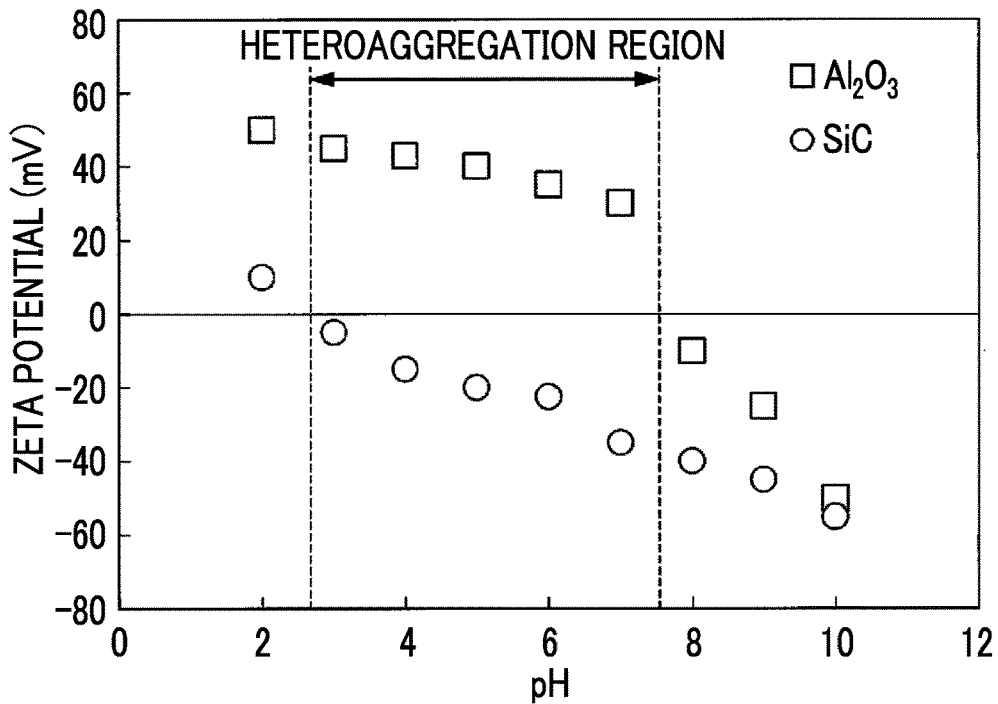
FIG. 2 is a graph showing the relationship between pH of slurry and a ζ potential of a particle.

FIG. 2 is a graph showing the relationship between pH of slurry and a ζ potential of a particle with respect to the aluminum oxide particles and the silicon carbide particles in the slurry. In the drawing, the horizontal axis indicates pH of the slurry, and the vertical axis indicates the ζ potential (unit: mV) of each particle.

As shown in the drawing, in a case where pH of a system is on the acidity side (pH<7), a metal oxide particle such as an aluminum oxide particle has a positive ζ potential. This is because, in a case where the pH of the system is on the acidity side, a hydroxyl group on the surface of the metal oxide particle is protonated ($H^+$) and the surface is positively charged.

On the other hand, in a case where the pH of the system is on the basicity side (pH>7), a metal oxide particle such as an aluminum oxide particle has a negative ζ potential. This is because, in a case where the pH of the system is on the basicity side, a proton is dissociated from the hydroxyl group on the surface of the metal oxide particle and the surface is negatively charged.

In contrast, the behavior of the ζ potential of the silicon carbide particle is different. As shown in the drawing, the silicon carbide particle has a ζ potential of 0 at around pH 2 to 3 and has a negative ζ potential in a wide range from an acidic region at around pH 3 to a basic region.

In a case where two particles having such a relationship coexist in the same slurry, so-called heteroaggregation in which both particles aggregate occurs in the range of the pH of the system in which the "surface charge of the aluminum oxide particle in the slurry is positive" and the "surface charge of the silicon carbide particle in the slurry is negative".

At this time, it is favorable if a dispersant is appropriately added to the slurry such that the aluminum oxide particles and the silicon carbide particles do not precipitate.

The pH of the system is preferably 3 or more and 7 or less, more preferable 5 or more and 7 or less, and further preferable 6 or more and 7 or less. In a case where the ζ potentials of both particles after the pH adjustment are compared with each other, the closer to each other the absolute values of the ζ potentials are, the more easily the heteroaggregation occurs, and thus a desired aggregation state is obtained.

The pH adjustment is performed by adding an acid to the slurry. As usable acids, inorganic acids such as nitric acid, phosphoric acid, hydrochloric acid, and sulfuric acid, and an organic acid such as acetic acid can be given as examples. Among these, hydrochloric acid, sulfuric acid, or the like generates chlorine or sulfur in an apparatus in the sintering step (described later), which may cause deterioration of the apparatus. For this reason, it is preferable to use nitric acid, phosphoric acid, an organic acid, or the like for the pH adjustment.

((c) Forming Step)

In the forming step, first, the dispersion liquid after the pH adjustment is spray-dried to obtain granules composed of mixed particles of the aluminum oxide particles and the silicon carbide particles.

Subsequently, the obtained granules are uniaxially formed (formed with uniaxial press) according to the shape of an aimed sintered body.

Subsequently, the obtained formed body is heated to, for example, 500° C. at normal pressure (without applying a press pressure) under an inert gas atmosphere, thereby removing contaminants such as moisture or the dispersion medium, which are included in the formed body. As inert gas, nitrogen or argon can be used. In this operation, as long as the contaminants can be removed from the formed body without modifying the formed body, the heating temperature is not limited to 500° C.

Further, it is preferable to include an oxidation step of performing oxidation treatment on the mixed particles configuring the formed body by heating the formed body from which the contaminants have been removed, to a temperature of, for example, 400° C. in the atmosphere. According to such an operation, in the oxidation treatment, oxide films are formed on the surfaces of the silicon carbide particles which are included in the mixed particles. Metal impurities which are included in the mixed particles easily elutes to the oxide film, and therefore, the metal impurities which are included in the mixed particles are present to be biased to the surfaces of the particles. Then, in a pressure-sintering step which will be described later, the metal impurities can be easily removed, which is preferable.

((d) Pressure-sintering Step)

In the pressure-sintering step, first, the formed body described above is heated (preliminarily heated) to a temperature lower than 1600° C. and at normal pressure (without applying a press pressure) in a vacuum atmosphere (a first non-oxidative atmosphere). According to this operation, by appropriately setting the temperature at the time of the preliminary heating, metal impurities such as alkali metal, which are included in the mixed particles, evaporate, and thus the metal impurities can be easily removed. For this reason, according to such an operation, the purity of the mixed particles is easily improved, and the volume resistivity value of the base is easily controlled.

Further, if in the forming step, the oxidation treatment is performed on the formed body from which contaminants have been removed as described above, the oxide film formed on the particle surface is volatilized by performing the preliminary heating under a vacuum atmosphere. At the same time, the metal impurities included in the oxide film evaporate. For this reason, the metal impurities can be easily removed from the formed body. Therefore, according to such an operation, the purity of the mixed particles is easily improved, and the volume resistivity value of the base is easily controlled.

In this embodiment, the term "vacuum" refers to a "state in a space filled with gas and having a pressure lower than the atmospheric pressure" and a state defined as an industrially usable pressure in the JIS standard. In this embodiment, the vacuum atmosphere may be low vacuum (100 Pa or higher). However, medium vacuum (in a range of 0.1 Pa to 100 Pa) is preferable, and high vacuum (in a range of $10^{-5}$ Pa to 0.1 Pa) is more preferable.

In the method for producing a composite sintered body of this embodiment, for example, after the preliminary heating is performed at 1200° C. for 4 hours or more under a vacuum atmosphere, air pressure is returned to the atmospheric pressure with argon.

Subsequently, the formed body subjected to the preliminary heating is pressure-sintered by heating the formed body to a temperature of 1600° C. or higher while compacting it with a pressure of 5 MPa or more in an argon atmosphere (a second non-oxidative atmosphere). According to such an operation, sintering of the aluminum oxide particles or the silicon carbide particles which are included in the formed body progresses, and thus a dense sintered body having few pores is obtained.

In the method for producing a composite sintered body of this embodiment, sintering is performed under, for example, an argon atmosphere, at a temperature of 1600° C. or more and 1850° C. or less and a sintering pressure of 25 MPa or more and 50 MPa or less.

In the sintered body obtained by being produced by such a method, the amount of metal impurity is reduced, and thus the sintered body having high purity is obtained. In a case where the amount of metal impurities does not reach the target value, it is favorable if the preliminary heating time is lengthened or the preliminary heating temperature is increased.

FIGS. 3 to 8 are explanatory diagrams for explaining the method for producing a composite sintered body of this embodiment.

Figure 3:
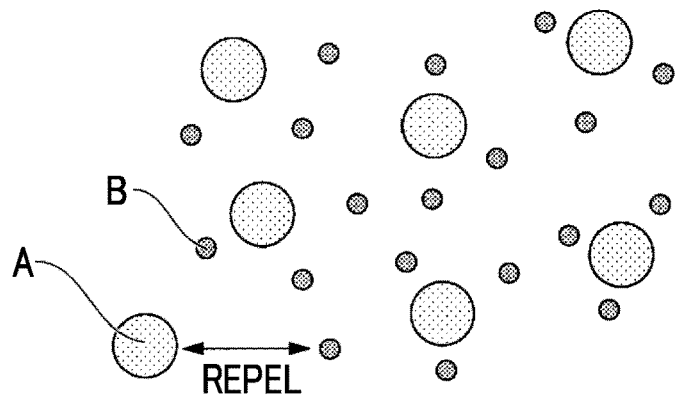
FIG. 3 is an explanatory diagram for explaining a method for producing a composite sintered body of the present embodiment.
Figure 4:
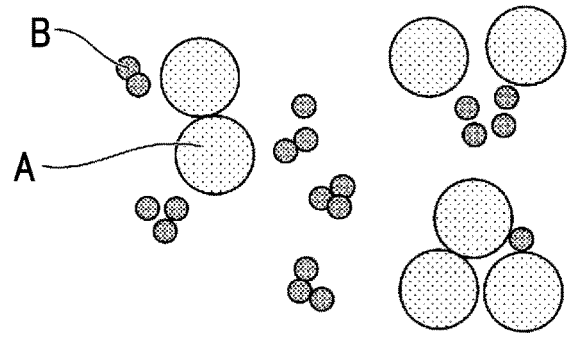
FIG. 4 is an explanatory diagram for explaining the method for producing a composite sintered body of the present embodiment.
Figure 5:
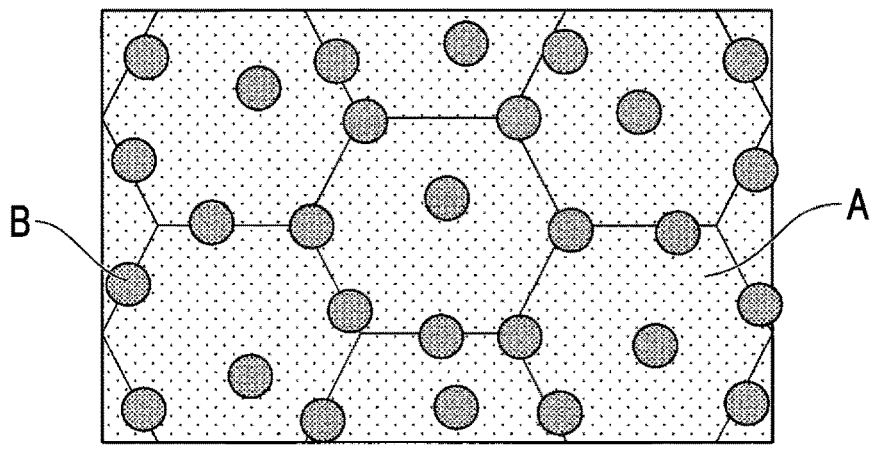
FIG. 5 is an explanatory diagram for explaining the method for producing a composite sintered body of the present embodiment.

FIG. 3 is a schematic diagram showing the state of particles in slurry of about pH 11, for example. FIG. 4 is a schematic diagram showing the state of the particles when the dispersion medium has been removed from the slurry shown in FIG. 3. FIG. 5 is a schematic diagram showing a composite sintered body produced by using the particles shown in FIG. 4.

In FIG. 5, the hexagon indicates a crystal grain of the aluminum oxide which is a main phase. Further, in FIG. 5, the black circle indicates a crystal grain of the silicon carbide which is a sub-phase, and the size of the black circle shows the size of the crystal grain of the silicon carbide.

In FIG. 3, symbol A indicates an aluminum oxide particle, and symbol B indicates a silicon carbide particle. As shown in FIG. 2 described above, in the slurry having pH of about 11, both the aluminum oxide particle and the silicon carbide particle have a negatively charged surface (the $\zeta$ potential is negative), and therefore, the particles repel each other in a slurry system.

In this way, as shown in FIG. 4, when the dispersion medium is removed in the (c) forming step, a situation occurs in which it is difficult for different types of particles to be uniformly mixed with each other and the same type of particles easily aggregate.

As a result, in the (d) sintering step, the aluminum oxide particles are easily sintered with each other in the form excluding the silicon carbide particles.

For this reason, as shown in FIG. 5, in the obtained composite sintered body, many crystal grains of the silicon carbide are present at crystal grain boundaries in the form of being excluded from the crystal grain of the aluminum oxide. Further, the crystal grain of the silicon carbide, which is present in the crystal grain of the aluminum oxide tends to grow greatly, and the number of particles also tends to decrease.

Figure 6:
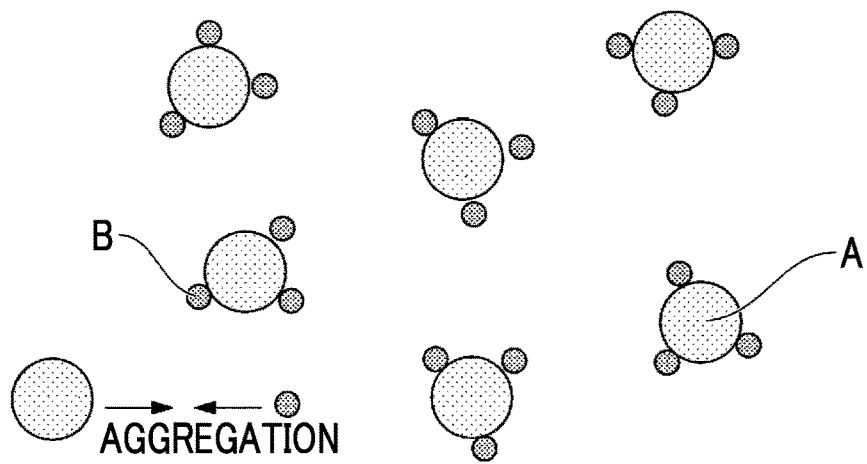
FIG. 6 is an explanatory diagram for explaining a method for producing a composite sintered body of the present embodiment.
Figure 7:
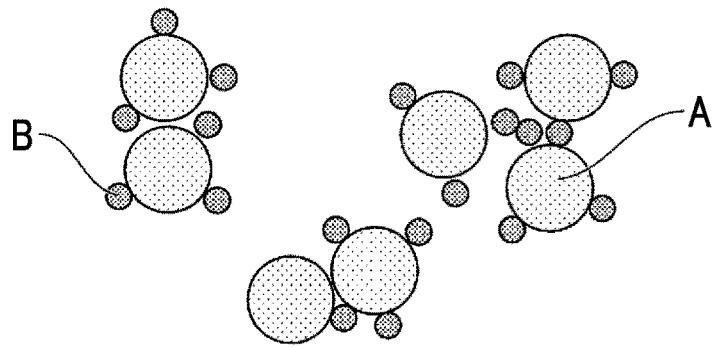
FIG. 7 is an explanatory diagram for explaining a method for producing a composite sintered body of the present embodiment.
Figure 8:
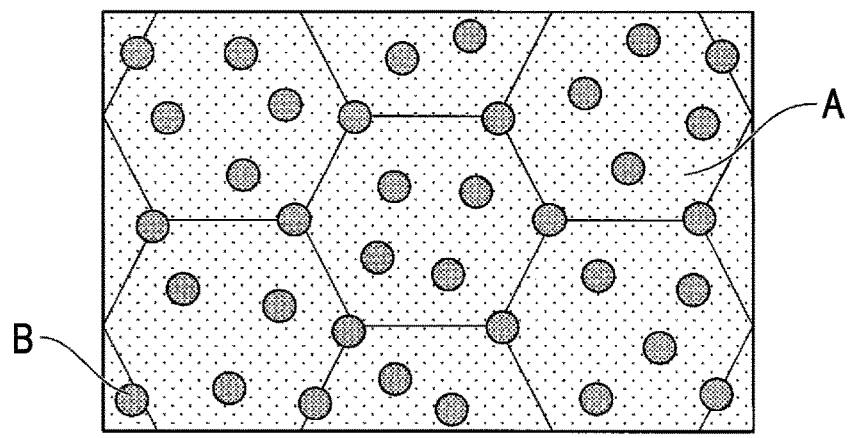
FIG. 8 is an explanatory diagram for explaining a method for producing a composite sintered body of the present embodiment.

On the other hand, FIG. 6 is a schematic diagram showing, for example, the state after the slurry of FIG. 3 is adjusted to about pH 6.5. FIGS. 6 to 8 are drawings corresponding to FIGS. 3 to 5, respectively.

As shown in FIG. 6, in the slurry having pH of about 6.5, the surface of the aluminum oxide particle is positively charged (the $\zeta$ potential is positive), and the surface of the silicon carbide particle is negatively charged (the $\zeta$ potential is negative).

For this reason, heteroaggregation occurs in the slurry system, and thus the silicon carbide particles which are relatively small particles adhere to the surface of the aluminum oxide particle which is a relatively large particle.

On the other hand, in the method for producing a composite sintered body of this embodiment, if the pH of the slurry is adjusted to about 6.5 and the $\zeta$ potential of the silicon carbide particle is lowered, the possibility of aggregation (homoaggregation) between the silicon carbide particles also increases.

In contrast, in a case where the silicon carbide particles which are used as described above are pre-oxidized, the dispersibility of the silicon carbide particles is improved. For this reason, in a case of using the silicon carbide particles subjected to the pre-oxidation treatment, the homoaggregation of the silicon carbide particles is suppressed and the heteroaggregation can be advanced dominantly. In this way, a desired aggregation state is easily obtained.

As shown in FIG. 7, when the dispersion medium is removed in the (c) forming step, the aluminum oxides in which silicon carbide has already adhered to the surface aggregate, whereby a situation occurs in which it is easy for different types of particles to be uniformly mixed with each other. As a result, in the (d) sintering step, the aluminum oxide particles are easily sintered together while the silicon carbide particles are incorporated therein.

For this reason, as shown in FIG. 8, in the obtained composite sintered body, the aluminum oxide grows while taking in a large number of silicon carbide crystal grains. For this reason, the presence amount of the crystal grains of the silicon carbide at the crystal grain boundary of the aluminum oxide is reduced. Further, also in the crystal grain of the aluminum oxide, the crystal grain of the silicon carbide tend to become small and the number of particles also tends to increase.

By the above, the composite sintered body of this embodiment can be produced.

The obtained composite sintered body can be ground in a subsequent step to form a desired base. The projection portions formed on the placing surface of the base can be appropriately formed by a known method.

According to the composite sintered body as described above, it is possible to achieve both the high dielectric constant and the low dielectric loss tangent.

Further, according to the electrostatic chuck part and the electrostatic chuck device using such a composite sintered body, they can be suitably used in a low frequency region.

Further, according to the method for producing a composite sintered body as described above, the composite sintered body described above can be easily produced.

Further, according to the electrostatic chuck part and the electrostatic chuck device as described above, high performance with a high wafer attraction force and a high withstand voltage can be obtained.

The preferred embodiment of the present invention has been described above with reference to the accompanying drawings. However, the present invention is not limited to such an example. The shapes, combinations, or the like of the respective constituent members shown in the example described above are merely examples, and various changes can be made based on design requirements or the like within a scope which does not depart from the gist of the present invention.

EXAMPLE

Hereinafter, the present invention will be described with examples. However, the present invention is not limited to these examples.

(Volume Resistivity Value)

In this example, the volume resistivity value of a disk-shaped sintered body was measured by a direct-current three-terminal method.

(Used Equipment)

Screen printer: MODEL MEC-2400 type manufactured by Mitani Micronics Co., Ltd.

Resistivity measuring device: manufactured by NISHI-YAMA-SEISAKUSHO Co., Ltd.

Insulation meter: digital insulation meter (Model DSM-8103, HIOKI E.E. Corporation)

(Measurement Conditions)

Temperature: room temperature (24° C.), 50° C., 100° C., 150° C., 200° C., 250° C., 300° C.

Atmosphere: nitrogen (purity: 99.99995%, flow rate: 200 ml/min.)

Applied voltage: 0.5 kV, 1 kV (Measuring Method)

Figure 9:
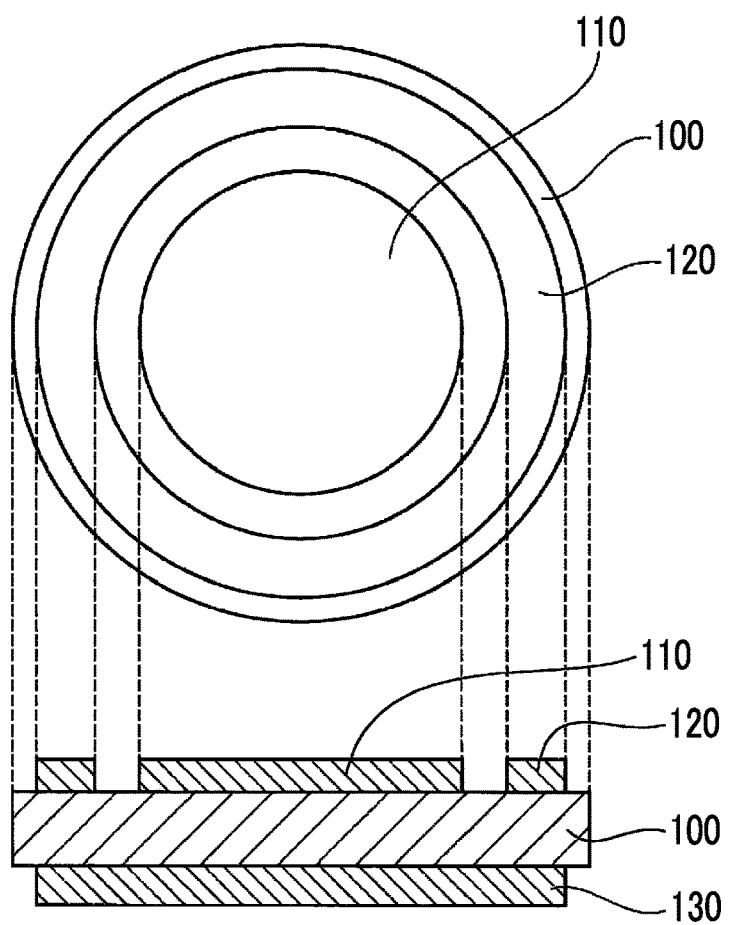
FIG. 9 is a schematic diagram showing a state of a sintered body when measuring a volume resistivity value in an example.

Silver paste (NP-4635 manufactured by Noritake Co., Ltd.) was printed on the upper and lower surfaces of the sintered body by using a screen printer, and dried at 100° C. for 12 hours in the atmosphere, and then baked at 450° C. for 1 hour in the atmosphere to form a main electrode, a guard electrode, and a counter electrode. FIG. 9 is a schematic diagram showing the state of the sintered body when measuring the volume resistivity value in this example. In the drawing, reference numeral 100 denotes the sintered body, reference numeral 110 denotes the main electrode, reference numeral 120 denotes the guard electrode, and reference numeral 130 denotes the counter electrode.

At this time, the diameter of the main electrode was 1.47 cm, and the inner diameter of the guard electrode was 1.60 cm.

A direct-current voltage was applied to the sintered body with the electrodes formed thereon as described above, at each measurement temperature, and an electric current after charging for 1 minute was measured to obtain the volume resistance of the sintered body. Thereafter, a volume resistivity value ($\rho v$) was calculated from the following expression (1) by using the thickness of the sintered body and the area of the electrode.

$$\rho v = S/t \times Rv = S/t \times V/I \quad (1)$$

(S: effective area (cm$^2$) of an electrode, t: thickness (cm) of a sintered body, Rv: volume resistance, V: direct-current voltage (V), I: electric current (A))

(Relative Dielectric Constant and Dielectric Loss Tangent)

In this example, a relative dielectric constant and a dielectric loss tangent were measured by a parallel plate method using a precision impedance analyzer (model number: 4294A, manufactured by Agilent Technologies) and a dielectric test fixture (model number: 16451B, manufactured by Agilent Technologies).

(Withstand Voltage)

In this example, a voltage (withstand voltage) at which an electric current of 1 µA flows through a test piece when voltage is applied at a rate of temperature rise of 1 kV/sec in silicone oil at room temperature after the sintered body is sandwiched between cylindrical electrodes each having a diameter of 20 mm was measured by using a high-voltage power supply (model HGR10-20P, manufactured by Matsuda Precision Co., Ltd.).

(Proportion of Crystal Grains of Silicon Carbide Dispersed in Crystal Grains of Metal Oxide)

In this example, the surface of a composite oxide (a sintered body) was mirror-polished with a diamond paste of 3 µm, and then thermal etching was performed at 1400° C. for 30 minutes under an argon atmosphere.

The surface of the obtained sintered body was subjected to structure observation at a magnification of 10000 by using a scanning electron microscope (model number: S-4000, manufactured by Hitachi High-Technologies Corporation).

The obtained electron micrograph was incorporated into image analysis type particle size distribution measurement software (Mac-View Version 4) and the area of 200 or more silicon carbide particles was calculated. From the electron micrograph, whether or not each silicon carbide particle is present in the crystal grain of the metal oxide was determined, and the proportion of the crystal grains of the silicon carbide dispersed in the crystal grains of the metal oxide to the total silicon carbide particles from which the area was calculated was determined.

(Average Crystal Grain Size of Crystal Grains of Metal Oxide)

The above electron micrograph was incorporated into image analysis type particle size distribution measurement software (Mac-View Version 4), and the major axis diameters of 200 or more metal oxide crystal grains were calculated. The arithmetic mean value of the obtained major axis diameter of each crystal grain was taken as the "average crystal grain size" to be determined.

Example 1

As a starting material, β-SiC type silicon carbide (β-SiC) particles having an average particle diameter of 0.03 µm and synthesized by thermal plasma CVD, and aluminum oxide ($Al_2O_3$) particles having an average particle diameter of 0.1 µm and the amount of metal impurity of 95 ppm were used.

With respect to the β-SiC particles, the particle surface was oxidized by performing heating treated at 500° C. for 12 hours under the air atmosphere. Hereinafter, the above oxidation treatment is referred to as "pre-oxidation". In the following steps, β-SiC subjected to the pre-oxidation treatment was used.

Weighing was performed such that the β-SiC particles are 7% by mass with respect to the total amount of the β-SiC particles and the $Al_2O_3$ particles, and the β-SiC particles and the $Al_2O_3$ particles were put in distilled water containing a dispersant. The dispersion liquid with the β-SiC particles and the $Al_2O_3$ particles put therein was subjected to dispersion treatment by an ultrasonic dispersing device and then pulverized and mixed by using a two-stream particle collision type pulverizing and mixing device.

This operation corresponds to the "mixing step" in the present invention.

With respect to the obtained mixed solution, nitric acid was added to slurry to adjust pH of the slurry to 6.5.

This operation corresponds to the "step of adjusting pH" in the present invention.

The slurry with adjusted pH was spray-dried by a spray dryer to obtain mixed particles of β-SiC and $Al_2O_3$.

This operation corresponds to apart of the "forming step" in the present invention.

Subsequently, the mixed particles were heated to 370° C. under a nitrogen atmosphere to remove moisture and the dispersant (contaminants).

The mixed particles were subjected to uniaxial press forming at a press pressure of 8 MPa to obtain a formed body having a diameter of 320 mm and a thickness of 15 mm.

This operation corresponds to apart of the "forming step" in the present invention.

The obtained formed body was set in a graphite mold and pressure-sintering was performed. First, the formed body was heated to 1200° C. under a vacuum atmosphere without applying a press pressure thereto. Thereafter, sintering was performed at a press pressure of 40 MPa and a temperature of 1800° C. under an argon atmosphere to obtain a composite sintered body of Example 1.

This operation corresponds to the "pressure-sintering step" in the present invention.

Further, an electron micrograph of the composite sintered body of Example 1 was taken under the conditions described above. When the average crystal grain size of $Al_2O_3$ was determined from the obtained electron micrograph, the average crystal grain size was 1.41 μm. Further, when the average crystal grain size of SiC was determined, the average crystal grain size was 0.22 μm.

The proportion of the crystal grains of SiC dispersed in the crystal grains of $Al_2O_3$ was 27%.

Example 2

A composite sintered body of Example 2 was obtained in the same manner as in Example 1 except that the β-SiC particles are 5% by mass with respect to the total amount of the β-SiC particles and the $Al_2O_3$ particles.

Further, an electron micrograph of the composite sintered body of Example 2 was taken under the conditions described above. When the average crystal grain size of $Al_2O_3$ was determined from the obtained electron micrograph, the average crystal grain size was 1.44 μm. Further, when the average crystal grain size of SiC was determined, the average crystal grain size was 0.18 μm.

The proportion of the crystal grains of SiC dispersed in the crystal grains of $Al_2O_3$ was 41%.

Example 3

A composite sintered body of Example 3 was obtained in the same manner as in Example 2 except that the dispersion treatment and the pulverizing and mixing were performed using a sand mill, instead of performing the dispersion treatment on the dispersion liquid in which the β-SiC particles and the $Al_2O_3$ particles are put, by using the ultrasonic dispersion device, and then performing the pulverizing and mixing by using the two-stream particle collision type pulverizing and mixing device.

In the steps of the dispersion treatment and the pulverizing and mixing using the sand mill described above, alumina beads having a particle diameter of φ0.1 mm were used and rotated at 2500 rpm for 2 hours.

Comparative Example 1

A raw material was weighed such that the β-sic particles are 8.5% by mass with respect to the total amount of the β-SiC particles and the $Al_2O_3$ particles, and the raw material was pulverized and mixed by using the two-stream particle collision type pulverizing and mixing device, after the dispersion treatment with the ultrasonic dispersion device.

With respect to the obtained mixed solution, nitric acid was added to slurry to adjust pH of the slurry to 6.5.

The slurry with adjusted pH was spray-dried by a spray dryer to obtain mixed particles of β-SiC and $Al_2O_3$.

The mixed particles were subjected to uniaxial press forming at a press pressure of 8 MPa to obtain a formed body having a diameter of 320 mm and a thickness of 15 mm.

Subsequently, the formed body was heated to 370° C. under a nitrogen atmosphere without applying a press pressure thereto to remove moisture and the dispersant (contaminants). Thereafter, the formed body with the contaminants removed therefrom was heated to 370° C. in the atmosphere to oxidize the surfaces of the β-SiC particles which are included in the formed body.

The obtained formed body was sintered in the same manner as in Example 1 to obtain a composite sintered body of Comparative Example 1.

An electron micrograph of the composite sintered body of Comparative Example 1 was taken under the conditions described above. When the average crystal grain size of $Al_2O_3$ was determined from the obtained electron micrograph, the average crystal grain size was 0.94 μm.

Further, when the average crystal grain size of SiC was determined, the average crystal grain size was 0.34 μm.

The proportion of the crystal grains of SiC dispersed in the crystal grains of $Al_2O_3$ was 14%.

Comparative Example 2

A composite sintered body of Comparative Example 2 was obtained in the same manner as in Comparative Example 1 except that the β-SiC particles are 4% by mass with respect to the total amount of the β-SiC particles and the $Al_2O_3$ particles.

Further, an electron micrograph of the composite sintered body of Comparative Example 2 was taken under the conditions described above. When the average crystal grain size of $Al_2O_3$ was determined from the obtained electron micrograph, the average crystal grain size was 1.05 μm. Further, when the average crystal grain size of SiC was determined, the average crystal grain size was 0.29 μm.

The proportion of the crystal grains of SiC dispersed in the crystal grains of $Al_2O_3$ was 18%.

Comparative Example 3

A composite sintered body of Comparative Example 3 was obtained in the same manner as in Comparative Example 1 except that the β-SiC particles are 12% by mass with respect to the total amount of the β-SiC particles and the $Al_2O_3$ particles and the temperature of the oxidation treatment on the β-SiC particles which are included in the formed body after press forming was set to 500° C.

Further, an electron micrograph of the composite sintered body of Comparative Example 3 was taken under the conditions described above. When the average crystal grain size of $Al_2O_3$ was determined from the obtained electron micrograph, the average crystal grain size was 0.85 μm. Further, when the average crystal grain size of SiC was determined, the average crystal grain size was 0.27 μm.

The proportion of the crystal grains of SiC dispersed in the crystal grains of $Al_2O_3$ was 16%.

The evaluation results of Examples 1 to 3 and Comparative Examples 1 to 3 are shown in Tables 1 to 3.

TABLE 1

|  | Pre-oxidation treatment temperature (° C.) | Main oxidation treatment temperature (° C.) | SiC addition amount (% by mass) |
|---|---|---|---|
| Example 1 | 500 | — | 7 |
| Example 2 | 500 | — | 5 |
| Example 3 | 500 | — | 5 |
| Comparative Example 1 | — | 370 | 8.5 |
| Comparative Example 2 | — | 370 | 4 |
| Comparative Example 3 | — | 500 | 12 |

TABLE 2

|  | Al$_2$O$_3$ grain size (μm) | SiC grain size (μm) | Presence ratio of SiC particles in Al$_2$O$_3$ particles (%) |
|---|---|---|---|
| Example 1 | 1.41 | 0.22 | 27 |
| Example 2 | 1.44 | 0.18 | 41 |
| Example 3 | 1.31 | 0.15 | 48 |
| Comparative Example 1 | 0.94 | 0.34 | 14 |
| Comparative Example 2 | 1.05 | 0.29 | 18 |
| Comparative Example 3 | 0.85 | 0.27 | 16 |

TABLE 3

|  | Volume resistivity value (Ω · cm) | Dielectric constant @ 1 kHz | Dielectric loss tangent @ 1 kHz |
|---|---|---|---|
| Example 1 | $5.0 \times 10^{15}$ | 15.4 | 0.0018 |
| Example 2 | $8.0 \times 10^{15}$ | 13.1 | 0.0011 |
| Example 3 | $5.7 \times 10^{15}$ | 13.1 | 0.0004 |
| Comparative Example 1 | $4.0 \times 10^{15}$ | 12.6 | 0.0071 |
| Comparative Example 2 | $6.0 \times 10^{15}$ | 12.0 | 0.0052 |
| Comparative Example 3 | $1.5 \times 10^{15}$ | 12.4 | 0.0042 |

As a result of the evaluation, in the composite sintered bodies of the examples, the dielectric constant was improved as compared with the composite sintered bodies of the comparative examples.

Further, in the composite sintered bodies of the examples, the dielectric loss tangent was significantly reduced as compared with the composite sintered bodies of the comparative examples.

From the results of this embodiment, it was found that the composite sintered body according to the present invention has both the high dielectric constant and the low dielectric loss tangent, and it was found that the present invention is useful.

INDUSTRIAL APPLICABILITY

It is possible to provide a composite sintered body for an electrostatic chuck, which has both the high dielectric constant and the low dielectric loss tangent. Further, it is possible to provide an electrostatic chuck member and an electrostatic chuck device using such a composite sintered body. Further, it is possible to provide a method for producing a composite sintered body, which allows such a composite sintered body to be easily produced.

REFERENCE SIGNS LIST

1: electrostatic chuck device
2: electrostatic chuck part
3: temperature adjusting base part
3b: through-hole
4: adhesion layer
5: heater element
6: adhesion layer
7: insulating plate
8: adhesive layer
10: focus ring
11: placing plate (base)
11a: placing surface
11b: projection portion
12: supporting plate (base)
13: electrostatic attraction electrode
14: insulating material layer
15: power supply terminal
15a: glass
16: through-hole
17: power supply terminal
18: glass
19: groove
20: temperature sensor
21: installation hole
22: temperature measurement part
23: excitation unit
24: fluorescence detector
25: control unit
28: gas hole
29: glass
100: sintered body
110: main electrode
120: guard electrode
130: counter electrode
A: aluminum oxide particle
B: silicon carbide particle
3A: flow path
W: plate-shaped sample

The invention claimed is:

1. A composite sintered body which is a ceramic composite sintered body, comprising:
a metal oxide which is a main phase; and
silicon carbide which is a sub-phase,
wherein crystal grains of the silicon carbide are dispersed in crystal grains of the metal oxide and at crystal grain boundaries of the metal oxide, and
a proportion of the crystal grains of the silicon carbide dispersed in the crystal grains of the metal oxide is 25% or more in an area ratio with respect to a total crystal grains of the silicon carbide.

2. The composite sintered body according to claim 1, wherein the metal oxide is aluminum oxide or yttrium oxide.

3. The composite sintered body according to claim 1, wherein an average crystal grain size of the metal oxide is 1.2 μm or more and 10 μm or less.

4. An electrostatic chuck member comprising:
a plate-shaped base which is formed of, as a forming material, the composite sintered body according to claim 1, the base having one principal surface which is a placing surface on which a plate-shaped sample is placed; and
an electrostatic attraction electrode provided on a side opposite to the placing surface of the base, or in an interior of the base.

5. An electrostatic chuck device comprising:
the electrostatic chuck member according to claim 4.

6. A method for producing a composite sintered body, comprising:
a step of mixing metal oxide particles and silicon carbide particles;
a step of adjusting pH of slurry obtained in the mixing step to a range in which surface charges of the metal oxide particles in the slurry become positive and surface charges of the silicon carbide particles in the slurry become negative;

a step of forming a formed body after a dispersion medium is removed from the slurry with adjusted pH; and a step of pressure-sintering the obtained formed body by heating the formed body to a temperature of 1600° C. or higher while compacting the formed body with a pressure of 25 MPa or more under a non-oxidative atmosphere.

7. The method for producing a composite sintered body according to claim 6, wherein the step of mixing metal oxide particles and silicon carbide particles is a step of mixing metal oxide particles and silicon carbide particles while causing the metal oxide particles and the silicon carbide particles to collide with each other by injecting the metal oxide particles and the silicon carbide particles at high speed.

8. The method for producing a composite sintered body according to claim 6, further comprising:

a step of oxidizing surfaces of the silicon carbide particles, prior to the mixing step.

9. The method for producing a composite sintered body according to claim 6, wherein the step of adjusting pH makes the pH of the slurry 3 or more and 7 or less.

10. The method for producing a composite sintered body according to claim 6, wherein the metal oxide particles have a metal oxide content of 99.99% or more.

11. The composite sintered body according to claim 1, wherein the proportion of the metal oxide in the entire composite sintered body is 92% by mass or more.

12. The composite sintered body according to claim 1, wherein the proportion of the silicon carbide in the entire composite sintered body is 8% by mass or more.

13. The composite sintered body according to claim 1, wherein the silicon carbide which is included in the composite sintered boy is β-SiC.

14. The composite sintered body according to claim 13, wherein the volume ratio of the β-SiC is 4% by volume or more and 15% by volume or less with respect to the entire composite sintered body.

* * * * *